(12) United States Patent
Nakamura et al.

(10) Patent No.: US 10,742,354 B2
(45) Date of Patent: Aug. 11, 2020

(54) OPTICAL RECEIVER, OPTICAL TRANSMISSION DEVICE, AND METHOD FOR OPTICAL RECEIVER

(71) Applicant: NIPPON TELEGRAPH AND TELEPHONE CORPORATION, Tokyo (JP)

(72) Inventors: Masanori Nakamura, Yokosuka (JP); Mitsuteru Yoshida, Yokosuka (JP); Akira Hirano, Yokosuka (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 16/300,698

(22) PCT Filed: Jun. 20, 2017

(86) PCT No.: PCT/JP2017/022672
§ 371 (c)(1),
(2) Date: Nov. 12, 2018

(87) PCT Pub. No.: WO2017/221926
PCT Pub. Date: Dec. 28, 2017

(65) Prior Publication Data
US 2019/0288793 A1 Sep. 19, 2019

(30) Foreign Application Priority Data

Jun. 21, 2016 (JP) .................................. 2016-122863

(51) Int. Cl.
*H04B 10/61* (2013.01)
*H04L 1/00* (2006.01)
(Continued)

(52) U.S. Cl.
CPC .......... *H04L 1/0045* (2013.01); *H03M 13/29* (2013.01); *H03M 13/45* (2013.01); *H04B 10/07* (2013.01);
(Continued)

(58) Field of Classification Search
CPC ................................................... H04B 10/616
See application file for complete search history.

(56) References Cited

U.S. PATENT DOCUMENTS

2010/0150268 A1   6/2010 Sasaki
2013/0086443 A1   4/2013 Miyazaki
(Continued)

FOREIGN PATENT DOCUMENTS

JP   2013-078092 A    4/2013
WO   WO-2008/038749 A1   4/2008
(Continued)

OTHER PUBLICATIONS

OIF-FD-100G-DWDM-01.0-100G Ultra Long Haul DWDM Framework Document, https://www.oiforum.com/technical-work/implementation-agreements-ias/, Jun. 2009.
(Continued)

*Primary Examiner* — Nathan M Cors
(74) *Attorney, Agent, or Firm* — Harness, Dickey & Pierce, P.L.C.

(57) ABSTRACT

An optical receiver includes: a first calculation unit that obtains a log likelihood ratio for each M-dimension (M is a natural number), based on a received signal; and a second calculation unit that obtains a log likelihood ratio of an N dimensional symbol (N is a natural number), based on the log likelihood ratio for each M-dimension.

4 Claims, 12 Drawing Sheets

(51) Int. Cl.
   *H03M 13/45*    (2006.01)
   *H04B 10/07*    (2013.01)
   *H04B 10/516*   (2013.01)
   *H04L 27/00*    (2006.01)
   *H04B 10/2581*  (2013.01)
   *H03M 13/29*    (2006.01)

(52) U.S. Cl.
   CPC ....... *H04B 10/2581* (2013.01); *H04B 10/516* (2013.01); *H04B 10/616* (2013.01); *H04L 1/0041* (2013.01); *H04L 27/00* (2013.01)

(56) References Cited

U.S. PATENT DOCUMENTS

| | | | |
|---|---|---|---|
| 2014/0099103 A1 | 4/2014 | Djordjevic et al. | |
| 2016/0065315 A1* | 3/2016 | Koike-Akino | H04B 10/6165 398/44 |
| 2019/0081645 A1* | 3/2019 | Nakamura | H03M 13/45 |

FOREIGN PATENT DOCUMENTS

| | | |
|---|---|---|
| WO | WO-2014070275 A1 | 5/2014 |
| WO | WO-2016035895 A1 | 3/2016 |

OTHER PUBLICATIONS

T. J. Xia, S. Gringeri, and M. Tomizawa, "High-Capacity Optical Transport Networks," IEEE Communications Magazine, vol. 50, No. 11, pp. 170-178, Nov. 2012.
Toshiaki Koike-Akino, David S. Millar, Keisuke Kojima, and Kieran Parsons, "Eight-Dimensional Modulation for Coherent Optical Communications", Proc. (ECOC 2013).
Ramesh Pyndiah, Annie Picart and Alain Glavieux, "Performance of BlockTurbo Coded 16-QAM and 64-QAM Modulations". Global Telecommunications Conference, 1995. Globecom '95., IEEE ?(vol. 2 ).
Stephan ten Brink. "Convergence Behavior of Iteratively Decoded Parallel Concatenated Codes". IEEE Transactions on Communications, vol. 49, No. 10, pp. 1727 Oct. 2001.
Masanori Nakamura et al., 120-GBaud Coded 8 Dimensional 16QAM WDM Transmission Using Low-Complexity Iterative Decoding Based on Bit-Wise LogLikelihood Ratio, Optical Fiber Communications Conference and Exhibition (OFC),2017, Mar. 23, 2017.
International Search Report for PCT/JP2017/022672, ISA/JP, Tokyo, dated Aug. 15, 2017, with English translation attached.
European Search Report for EP 17815394.6; dated Dec. 4, 2019; 8 pp.

* cited by examiner

| NUMBER OF CALCULATIONS | CONVENTIONAL METHOD | PROPOSED METHOD |
|---|---|---|
| MULTIPLICATION | 8 x 4096 | 0 |
| SUMMATION | 8 x 4096 | 16 x 32 |
| Exp(·) | 1 x 4096 | 1 x 32 |
| Log(·) | 1 | 1 |

| f(1,1) | (1,2) | f(1,3) | f(1,4) | f(1,5) | f(1,6) | f(1,7) | f(1,8) |
|--------|-------|--------|--------|--------|--------|--------|--------|
| f(2,1) | f(2,2) | f(2,3) | f(2,4) | f(2,5) | f(2,6) | f(2,7) | f(2,8) |
| f(3,1) | f(3,2) | f(3,3) | f(3,4) | f(3,5) | f(3,6) | f(3,7) | f(3,8) |
| f(4,1) | f(4,2) | f(4,3) | f(4,4) | f(4,5) | f(4,6) | f(4,7) | f(4,8) |
| f(5,1) | f(5,2) | f(5,3) | f(5,4) | f(5,5) | f(5,6) | f(5,7) | f(5,8) |
| f(6,1) | f(6,2) | f(6,3) | f(6,4) | f(6,5) | f(6,6) | f(6,7) | f(6,8) |
| f(7,1) | f(7,2) | f(7,3) | f(7,4) | f(7,5) | f(7,6) | f(7,7) | f(7,8) |
| f(8,1) | f(8,2) | f(8,3) | f(8,4) | f(8,5) | f(8,6) | f(8,7) | f(8,8) |

OPTICAL RECEIVER, OPTICAL TRANSMISSION DEVICE, AND METHOD FOR OPTICAL RECEIVER

CROSS-REFERENCE TO RELATED APPLICATIONS

This application is a 371 U.S. National Stage of International Application No. PCT/JP2017/022672, filed Jun. 20, 2017. Priority is claimed on Japanese Patent Application No. 2016-122863, filed Jun. 21, 2016. The disclosures of both of the above applications are incorporated herein by reference.

TECHNICAL FIELD

The present invention relates to an optical transmitter, an optical receiver, and an optical transmission device.

BACKGROUND ART

Due to the increased communication traffic of recent years, adoption of the DP-16QAM (quadrature amplitude modulation) method (for example, refer to Non-Patent Document 2) in the backbone network of the optical communication system is being considered for the next generation 400 Gbps class transmission to replace the DP-QPSK (dual polarization-quadrature phase shift keying) method (for example, refer to Non-Patent Document 1). The DP-QPSK method is a modulation method that is adopted as a standard for 100 Gbps class transmission. The DP-16QAM method is a modulation method with higher frequency utilization efficiency than the DP-QPSK method.

In the DP-16QAM, each polarized wave is independently modulated by 16QAM for the X polarized wave and Y polarized wave. On the reception side, a modulated signal is input to a coherent receiver and then digitized by an ADC (analog to digital converter). Then, polarized wave separation is performed on the signal by means of digital signal processing, and symbol determination is performed on the signal as an independent signal.

As a method for further increasing the transmission capacity, further multi-leveling modulation of signals of the DP-64QAM method (for example, refer to Non-Patent Document 2) or the like, the frequency utilization efficiency of which is higher than DP-16QAM in 1 Tbps class transmission, is being considered. However, multi-leveling modulation of signals would cause the minimum Euclidean distance between symbols to reduce, cause noise resistance properties to decrease, and limit transmission distance.

In recent years, with respect to the reduction in the minimum Euclidean distance accompanying the improvement of the frequency utilization efficiency, there has been proposed a modulation method by means of signal point arrangement in an N-dimension space (for example, refer to Non-Patent Document 3). The modulation method expands the design dimension of signal point arrangement to polarization, time, and wavelength direction, which had been treated as independent dimensions in the past, and expands the minimum Euclidean distance by returning the relationship between the frequency utilization efficiency and the minimum Euclidean distance to the overview of the sphere packing problem in the N-dimensional space.

PRIOR ART DOCUMENTS

Non-Patent Documents

[Non-Patent Document 1] OIF, "100 G Ultra Long Haul DWDM Framework Document".

[Non-Patent Document 2] T J Xia, S. Gringeri, and M. Tomizawa, "High-Capacity Optical Transport Networks," IEEE Communications Magazine, vol. 50, no. 11, pp. 170-178, November 2012.

[Non-Patent Document 3] Toshiaki Koike-Akino, David S. Millar, Keisuke Kojima, and Kieran Parsons, "Eight-Dimensional Modulation for Coherent Optical Communications", Proc. (ECOC 2013).

SUMMARY OF THE INVENTION

Problem to be Solved by the Invention

However, in order to deal with soft-decision error correction codes, it is necessary to calculate a log likelihood ratio (hereinafter, referred to as LLR (log-likelihood ratio)) for a multidimensional symbol. In general, an LLR is calculated from a multidimensional symbol by the following Equation (1).

[Equation 1]

$$L_{N-D}(b_j) = \log\left(\frac{\sum_{E_k \in S(b_j=0)} \exp(-\|\vec{E_r} - \vec{E_k}\|^2 / \sigma^2)}{\sum_{E_k \in S(b_j=1)} \exp(-\|\vec{E_r} - \vec{E_k}\|^2 / \sigma^2)}\right) \quad (1)$$

In Equation (1), "$L_{N-D}(b_j)$" represents the LLR of the j-th bit of the N-dimensional symbol. "$S(b_j=0 \text{ or } 1)$" represents an N-dimensional symbol set in which the j-th bit is "0" or "1". "$E_k$" represents an N-dimensional symbol. "$E_k$" represents a received 8D (dimensional) vector. "$\sigma^2$" represents variance of Gaussian noise. "$L_{N-D}(b_j)$" can be expressed as the following Equation (2) when there is feedback of prior information from the soft determination error correction decoder on the subsequent stage.

[Equation 2]

$$L_{N-D}(b_j) = \log\left(\frac{\sum_{E_k \in S(b_j=0)} \exp\left(-\frac{\|\vec{E_r} - \vec{E_k}\|^2}{\sigma^2} + \sum_{b_l = Demap(E_k)} (1-b_l)LLR_{soft\ dec.}(bl)\right)}{\sum_{E_k \in S(b_j=1)} \exp\left(-\frac{\|\vec{E_r} - \vec{E_k}\|^2}{\sigma^2} + \sum_{b_l = Demap(E_k)} (1-b_l)LLR_{soft\ dec.}(bl)\right)}\right) \quad (2)$$

In Equation (2), "$LLR_{soft\ dec.}$" represents prior information from the soft determination error correction decoder. Also, "$b_l = Demap(E_k)$" represents conversion of the N-dimensional symbol $E_k$ to a corresponding bit string.

As described above, in order to calculate Equation (1) and Equation (2), it is necessary to calculate Euclidean distances for all candidate multidimensional symbols, resulting in an increase in the amount of calculation.

In view of the above circumstances, an object of the present invention is to provide a technique for reducing the amount of calculation.

Means for Solving the Problem

An optical receiver according to an aspect of the present invention includes: a first calculation unit that obtains a log likelihood ratio for each M-dimension (M is a natural number), based on a received signal; and a second calculation unit that obtains a log likelihood ratio of an N dimensional symbol (N is a natural number), based on the log likelihood ratio for each M-dimension.

The above optical receiver may further include: a soft determination error correction code decoding circuit that performs soft determination error correction based on the log likelihood ratio of the N dimensional symbol; and a feedback unit that feedbacks, to the second calculation unit, an output from the soft determination error correction code decoding circuit. The second calculation unit may obtain a log likelihood ratio of the N-dimensional symbol, based on the log likelihood ratio of each M dimension that is updated based on the fed-back output result.

An optical transmission device according to an aspect of the present invention includes: the above optical transmitter; and an optical receiver. The optical receiver includes: a soft determination error correction code encoding circuit that adds, to an input bit string, a redundant bit used for soft determination error correction; an N-dimensional encoding circuit that associates the input bit string to which the redundant bit is added with a signal point arrangement of a N dimensional space (N is a natural number); an N-dimensional symbol mapping circuit that generates a modulation signal corresponding to an N-dimensional symbol, based on an output from the N-dimensional encoding circuit; and an optical modulation circuit that modulates light using the modulation signal and outputs it.

A method for an optical receiver according to an aspect of the present invention includes: obtaining a log likelihood ratio for each M-dimension (M is a natural number), based on a received signal; and obtaining a log likelihood ratio of an N dimensional symbol (N is a natural number), based on the log likelihood ratio for each M-dimension.

Effect of the Invention

According to the present invention, it is possible to reduce the amount of calculation.

EMBODIMENT FOR CARRYING OUT THE INVENTION

Hereinafter, an embodiment of the present invention will be described with reference to the drawings.

Figure 1:
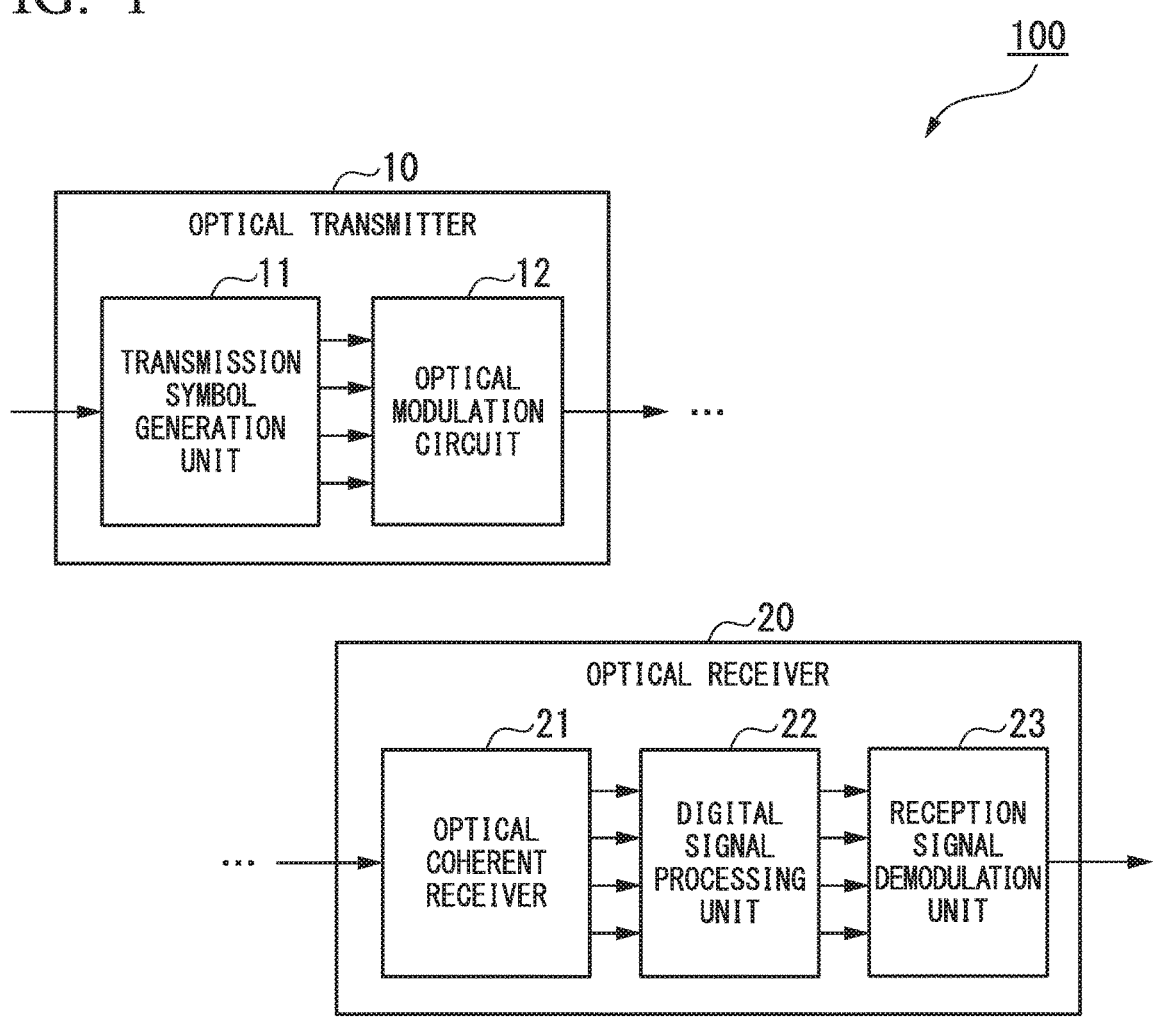
FIG. 1 is a block diagram showing a configuration of an optical transmission device according to an embodiment.

FIG. 1 is a block diagram showing a configuration of an optical transmission device according to the present embodiment. The optical transmission device 100 comprises an optical transmitter 10 and an optical receiver 20. In the example shown in FIG. 1, a configuration is shown in which the optical transmitter 10 and the optical receiver 20 are provided in the optical transmission device 100. However, the optical transmitter 10 and the optical receiver 20 may each be an individual device. In this case, the optical transmitter 10 and the optical receiver 20 are connected via a transmission path. The transmission path is configured using, for example, an optical fiber and an optical amplifier. An optical signal output from the optical transmitter 10 is transmitted through the optical fiber, is amplified by the optical amplifier, and is input to the optical receiver 20. Furthermore, a path switcher may be installed in the transmission path.

The optical transmitter 10 comprises a transmission symbol generation unit 11 and an optical modulation circuit 12. The transmission symbol generation unit 11 accepts an input of a transmission data series (bit string) which is binary information. After adding redundant data used for soft determination error correction to the input transmission data series, the transmission symbol generation unit 11 generates a modulation signal that corresponds to a multidimensional symbol, using the transmission data series. The transmission symbol generation unit 11 outputs the generated modulation signal to the optical modulation circuit 12.

The optical modulation circuit 12 is composed of a polarization-multiplexed Mach-Zehnder type vector modulator, a driver amplifier, and a laser module. The optical modulation circuit 12 accepts an input of the modulation signal output from the transmission symbol generation unit 11. The optical modulation circuit 12 amplifies the input modulation signal by the driver amplifier installed in each lane and modulates the optical signal from the laser module by using the polarization-multiplexed Mach-Zehnder type vector modulator. The optical modulation circuit 12 multiplexes and outputs the modulated optical signal.

When allocating a multidimensional symbol between wavelengths, in the case of allocating it between multi-core fiber cores, multi-mode fiber modes, or a combination of them, the optical modulation circuit 12 performs, from the transmission symbol generation unit 11, modulation by a modulator that corresponds to each dimension. That is to say, the optical modulation circuit 12 modulates light with respect to in-phase carrier wave, quadrature phase carrier wave, time, polarization, wavelength, and space (multimode, multi core).

The optical receiver 20 comprises an optical coherent receiver 21, a digital signal processing unit 22, and a reception signal demodulation unit 23. The optical coherent receiver 21 accepts an input of an optical signal. The optical coherent receiver 21 converts the input optical signal into a baseband signal (electric signal) by the locally emitted light from the laser module. The optical coherent receiver 21 outputs the electric signal to the digital signal processing unit 22. The electric signal output from the optical coherent receiver 21 is converted into a digital signal by an analog/digital converter (not shown in the figure) installed between the optical coherent receiver 21 and the digital signal processing unit 22, and then input to the digital signal processing unit 22.

The digital signal processing unit 22 accepts an input of the digital signal. The digital signal processing unit 22 compensates for waveform deterioration due to wavelength dispersion, polarization variation, and nonlinear optical effect that occur in the transmission path. Further, the digital signal processing unit 22 compensates for the phase noise due to the frequency error of the laser on the transmission side and the laser on the reception side and the line width of each laser. The reception signal demodulation unit 23 reconstructs the multidimensional vector from the modulation dimension allocated to the physical dimension in the optical receiver 20, calculates the LLR of the multidimensional symbol, performs the soft determination error correction, and then outputs the bit string data.

Figure 2:
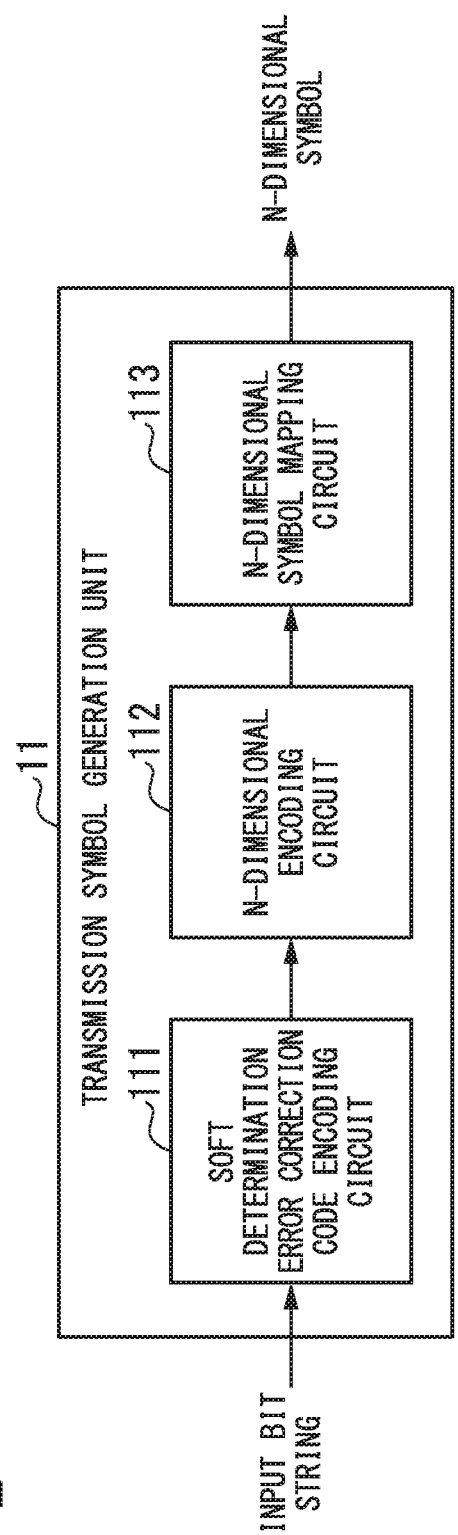
FIG. 2 is a diagram showing a configuration example of a transmission symbol generation unit 11 according to the present embodiment.

FIG. 2 is a diagram showing a configuration example of the transmission symbol generation unit 11. As shown in FIG. 2, the transmission symbol generation unit 11 comprises a soft determination error correction code encoding circuit (hereinafter, may be referred to as correction code encoding circuit) 111, an N-dimensional encoding circuit 112, and an N-dimensional symbol mapping circuit 113. The soft determination error correction code encoding circuit 111 is composed of an LDPC (low density parity check) code, a turbo encoder, or the like. The soft determination error correction code encoding circuit 111 adds a redundant bit necessary for performing soft determination error correction to the input transmission data series.

The N-dimensional encoding circuit 112 associates the transmission data series output from the soft determination error correction code encoding circuit 111 with signal points in the N-dimensional space and adds redundant bits. Here, N is an integer of 2 or more. The N-dimensional encoding circuit 112 is a circuit for securing a minimum Euclidean distance of a certain value or more after mapping in the N-dimensional symbol mapping circuit 113 by adding redundant bits. The N-dimensional encoding circuit 112 adds redundant bits so that the Euclidean distance between N-dimensional symbols after mapping becomes small when inputting input bits of different series having a small Hamming distance. This makes it possible to reduce bit errors when symbol errors occur.

The N-dimensional symbol mapping circuit 113 is composed of L (L=N/M) mapping circuits of the M dimension (M is a natural number less than N). The N-dimensional symbol mapping circuit 113 generates L M-dimensional symbols from the input transmission data series. At this time, the N-dimensional symbol mapping circuit 113 generates L M-dimensional symbols from the redundant bits added by the N-dimensional symbol mapping circuit 112, so that the L M-dimensional symbols are related to each other.

Figure 3:
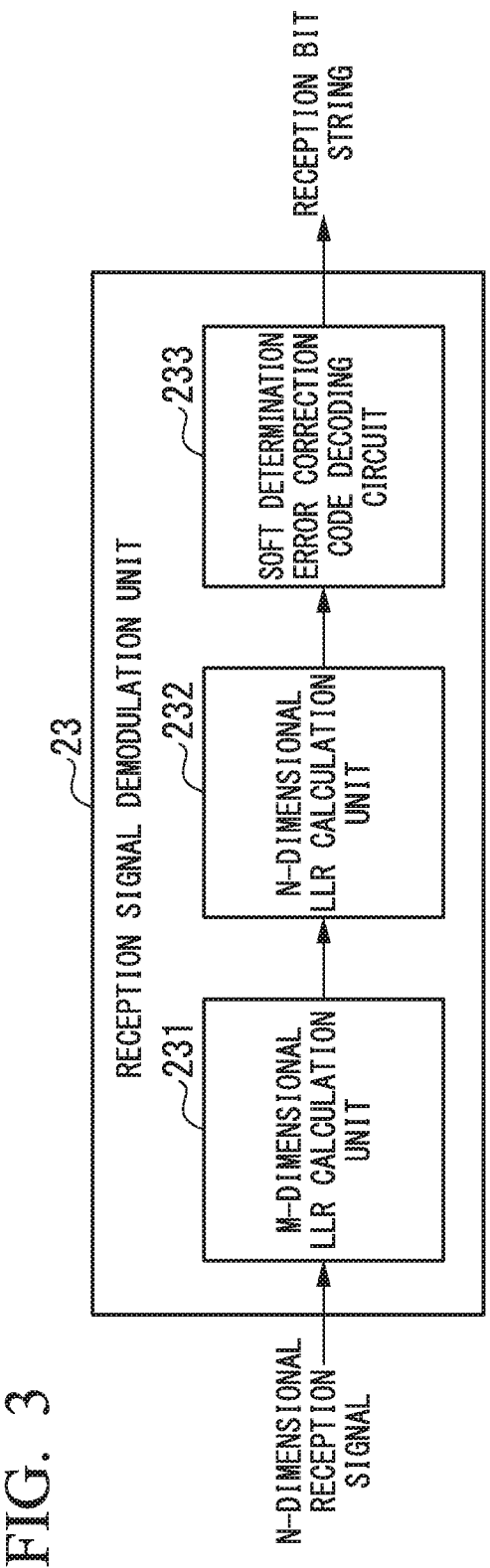
FIG. 3 is a diagram showing a configuration example of a reception signal demodulation unit 23 according to the present embodiment.

FIG. 3 is a diagram showing a configuration example of the reception signal demodulation unit 23. As shown in FIG. 3, the reception signal demodulation unit 23 comprises an M-dimensional LLR calculation unit (first calculation unit) 231, an N-dimensional LLR calculation unit (second calculation unit) 232, and a soft determination error correction code decoding circuit 233. The M-dimensional LLR calculation unit 231 calculates LLRs from the L M-dimensional symbols respectively. The N-dimensional LLR calculation unit 232 calculates an N-dimensional LLR from the LLR calculated by the M-dimensional LLR calculation unit 231. The soft determination error correction code decoding circuit 233 performs soft determination error correction, based on the LLR output from the N-dimensional LLR calculation unit 232.

Hereinafter, processing of the optical transmitter 10 and the optical receiver 20 in the present embodiment will be described as a specific example where "N=8", "M=2", and "L=4".

Figure 4:
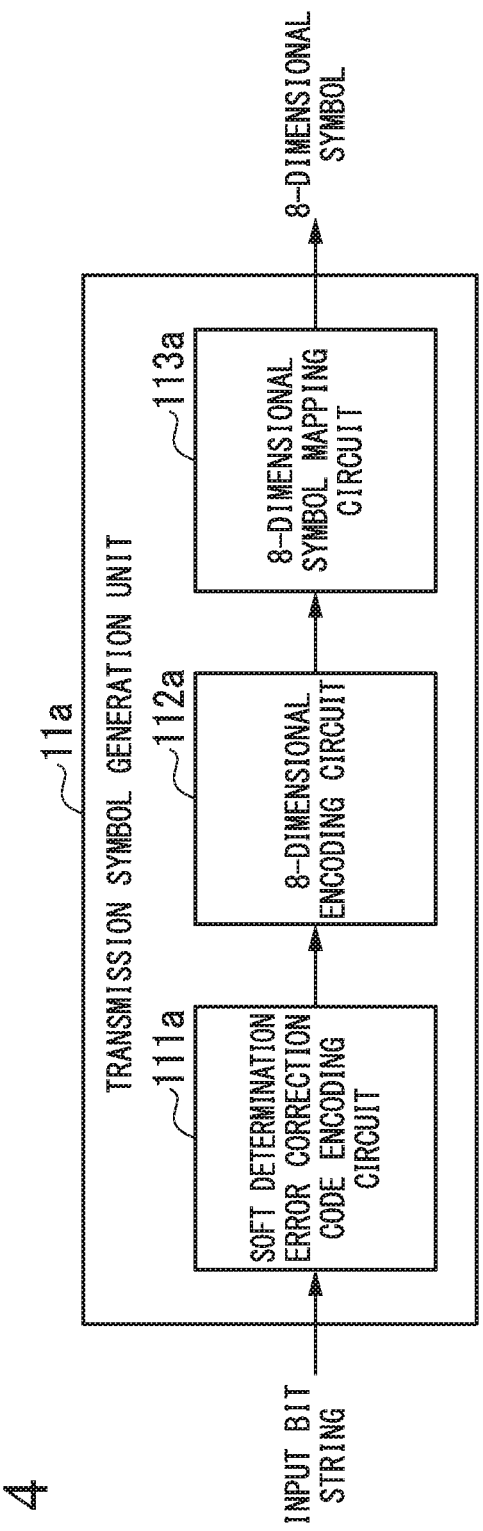
FIG. 4 is a diagram showing a configuration example of a transmission symbol generation unit 11a according to the present embodiment.
Figure 5:
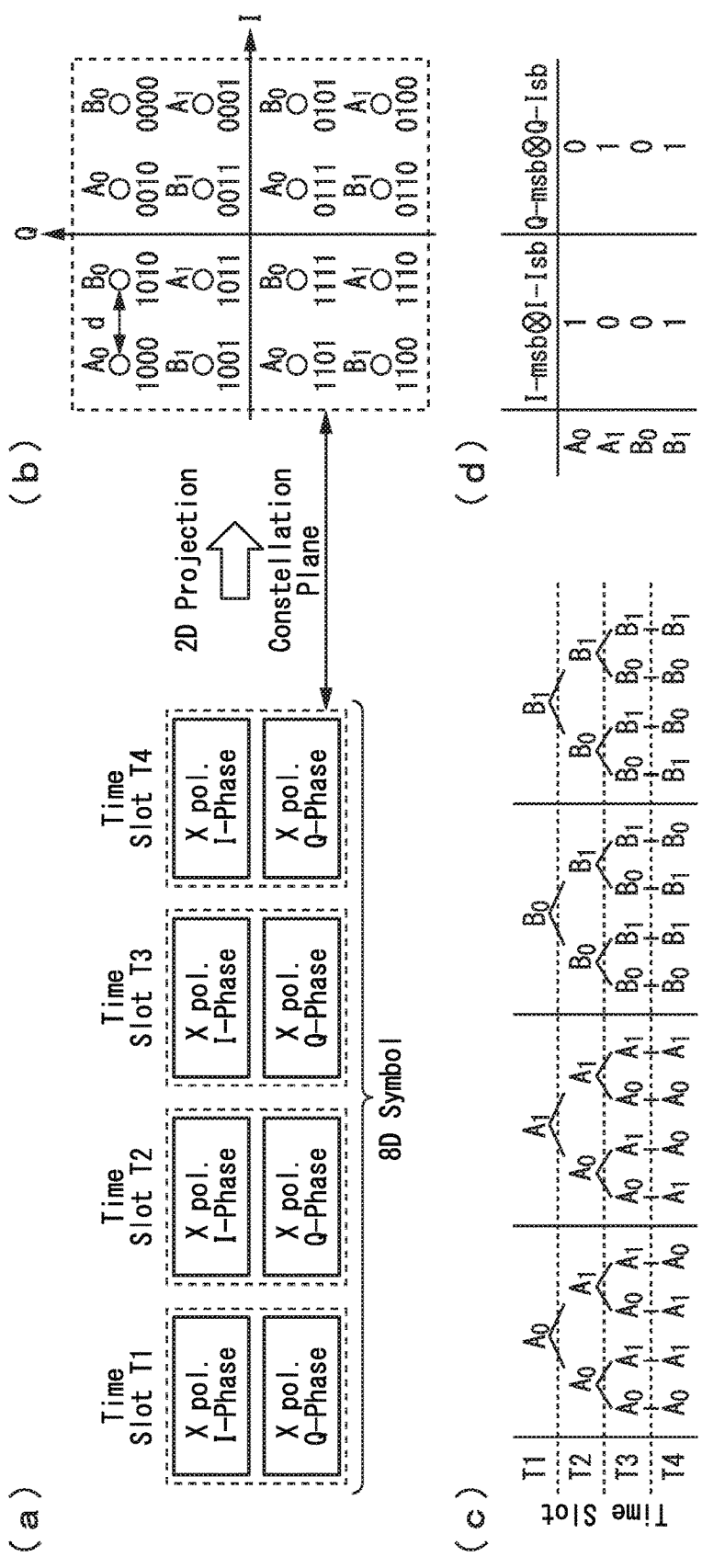
FIG. 5 is a diagram showing a configuration rule of an 8-dimensional symbol output by the configuration of the transmission symbol generation unit 11a shown in FIG. 4.

FIG. 4 is a diagram showing a configuration example of a transmission symbol generation unit 11a. FIG. 5 is a diagram showing a configuration rule of an 8-dimensional symbol output by the configuration of the transmission symbol generation unit 11a shown in FIG. 4.

As shown in FIG. 4, the transmission symbol generation unit 11a comprises a soft determination error correction code encoding circuit 111a, an 8-dimensional encoding circuit 112a, and an 8-dimensional symbol mapping circuit 113a. The soft determination error correction code encoding circuit 111a performs the same processing as the soft determination error correction code encoding circuit 111. That is to say, the soft determination error correction code encoding circuit 111a is configured using a general soft determination error correction code encoding circuit. The 8-dimensional encoding circuit 112a can be represented by the following Equations (3) to (6) based on the configuration rule of FIG. 5.

[Equation 3]
$$b_8 = b_1 \oplus b_2 \oplus b_3 \oplus b_4 \oplus b_5 \oplus b_6 \oplus b_7 \quad (3)$$

[Equation 4]
$$b_{12} = b_1 \oplus b_2 \oplus b_3 \oplus b_4 \oplus b_9 \oplus b_{10} \oplus b_{11} \quad (4)$$

[Equation 5]
$$b_{15} = b_1 \oplus b_3 \oplus b_5 \oplus b_7 \oplus b_9 \oplus b_{11} \oplus b_{13} \quad (5)$$

[Equation 6]
$$b_{16} = b_1 \oplus b_2 \oplus b_3 \oplus b_4 \oplus b_{13} \oplus b_{14} \oplus b_{15} \quad (6)$$

In Equations (3) to (6), b1 to b16 correspond to the output bit strings of the 8-dimensional encoding circuit 112a. b8, b12, b15 and b16 are redundant bits to be added. For other bits, the input bit is output as it is. According to the 2-dimensional symbol mapping rule of the portion (b) of FIG. 5, the 8-dimensional symbol mapping circuit 113a outputs one 16QAM for every 4 bits as in b1 to b4. In this example, "L=4", and a total of four 16QAM symbols are output. The portion (a) of FIG. 5 is shown as an example in which the allocation destination of the modulation dimension is expanded in the time direction (time slots). Since the 2 dimensions namely the quadrature phase and the in-phase are used as the physical dimensions in the four time slots, the total is 8 dimensions. This set is output as an 8-dimensional symbol from the 8-dimensional symbol mapping circuit 113a. The portions (c) and (d) of FIG. 5 represent the regularity of the 8-dimensional symbols output from the 8-dimensional encoding circuit 112a and the 8-dimensional symbol mapping circuit 113a.

Figure 6:
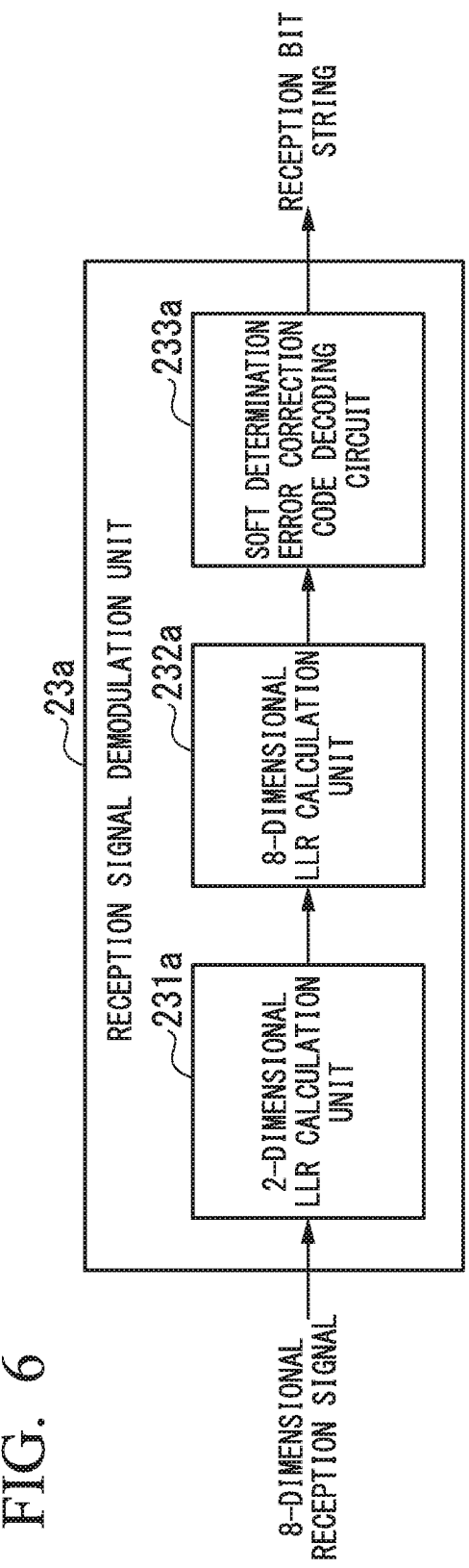
FIG. 6 is a diagram showing a configuration example of a reception signal demodulation unit 23a according to the present embodiment.

FIG. 6 is a diagram showing a configuration example of the reception signal demodulation unit 23a. As shown in FIG. 6, the reception signal demodulation unit 23a comprises a 2-dimensional LLR calculation unit (first calculation unit) 231a, an 8-dimensional LLR calculation unit (second calculation unit) 232a, and a soft determination error correction code decoding circuit 233a. The 2-dimensional LLR calculation unit 231a is configured using a 16QAM-LLR calculation circuit. The 16QAM-LLR calculation circuit can be represented simply as shown in the following Equations (7) to (8) based on Reference Document 1 below (Reference Document 1: Ramesh PYNDIA, Annie PICART and Alain GLAVIEUX, "Performance of Block Turbo Coded 16-QAM and 64-QAM Modulations". Global Telecommunications Conference, 1995. GLOBECOM '95, IEEE (Volume: 2)).

[Equation 7]

$$LLR_{16QAM\ I\text{-}MSB}, LLR_{16QAM\ Q\text{-}MSB} = \begin{cases} r & |r| \leq 2 \\ 2(r-1) & r > +2 \\ 2(r+1) & r < -2 \end{cases} \quad (7)$$

[Equation 8]

$$LLR_{16QAM\ I\text{-}LSB}, LLR_{16QAM\ Q\text{-}LSB} = \begin{cases} +(r-2) & |r| \geq 0 \\ -(r+2) & |r| < 0 \end{cases} \quad (8)$$

Figures 7, 8:
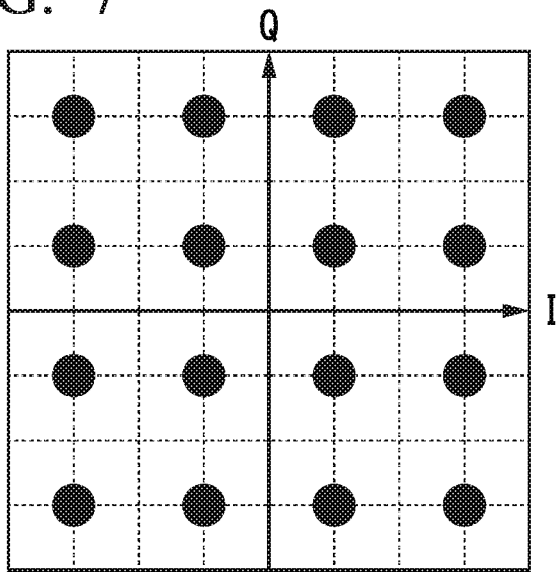
FIG. 7 is a diagram showing a constellation shape in a case of 16QAM in the present embodiment.
FIG. 8 is a diagram showing a comparison result in the present embodiment.

In the Equations (7) to (8), "I" represents an in-phase. "Q" represents a quadrature phase. "MSB" represents the most significant bit. "LSB" represents the least significant bit. For example, in b1 to b4 in the above Equations (3) to (6), the 16QAM I-MSB corresponds to b1. The 16QAM Q-MSB corresponds to b2. The 16QAM I-LSB corresponds to b3, and the 16QAM Q-LSB corresponds to b4. The 2-dimensional LLR calculation unit 231a calculates a 16QAM-LLR for each of four 2-dimensional symbols using the above Equations (7) and (8). In this example, more specifically, the 2-dimensional LLR calculation unit 231a calculates a 16QAM-LLR for each in-phase component and quadrature phase of four 2-dimensional symbols, using the above Equations (7) and (8). Accordingly, in this example, the 16QAM-LLR can be calculated for each dimension where "M=1". A specific example of the case where LLR can be calculated for each dimension with "M=1" is a case where the constellation shape such as 16QAM and 64QAM is a tetragonal lattice, that is, where the I component and Q component are orthogonal when focusing attention to the IQ plane. FIG. 7 is a diagram showing a constellation shape in the case of 16QAM. In the case of the example shown in FIG. 7, a 16QAM-LLR can be calculated for each 1-dimension where "M=1".

The 8-dimensional LLR calculation unit 232a accepts an input of the 16QAM-LLR for each of the four 2-dimensional symbols calculated by the 2-dimensional LLR calculation unit 231a. The 8-dimensional LLR calculation unit 232a calculates an 8D-16QAM-LLR based on the input of the 16-QAM-LLR for each 2-dimensional symbol. The 8D-16QAM-LLR represents the 16QAM-LLR of an 8-dimensional symbol. Hereinafter, a calculation method of the 8D-16QAM-LLR will be described.

By using the 16QAM-LLR, the posterior probability $P_{S\ 16QAM}$ to the 16QAM symbol point in 2 dimensions when obtaining a certain reception signal is expressed as the following Equation (9).

[Equation 9]

$$P_{S_{16QAM}} \propto \exp(\Sigma_{m=1}^{4}(1-b_m)LLR_{16QAM}(b_m)) \quad (9)$$

In Equation (9), "$LLR_{16QAM}$ (bm)" corresponds to the LLR of the 16QAM for the m-th bit. Similarly, the posterior probability $P_{S8D}$ to the 8-dimensional symbol point when a certain reception signal is obtained is expressed as the following Equation (10).

[Equation 10]

$$P_{S_{8D}} = \Pi_{l=1}^{4} P_{S_{16QAM}}(l) \propto \exp(\Sigma_{m=1}^{16}(1-b_m)LLR_{16QAM}(b_m)) \quad (10)$$

In Equation (10), "$P_S$ 16QAM (16QAM is the subscript of S) (l)" represents a posteriori probability of the 1-th 16QAM. The LLR8D for the 8-dimensional symbol can be expressed by the following Equation (11) using the Equation (10) for the Equation (1).

[Equation 11]

$$LLR_{8D}(k) \approx \log_e \left( \frac{\sum_{l=1}^{4096/2} \exp\left(\sum_{m=1}^{16}(1-b_m(k=m:0))LLR_{16QAM}(b_m)\right)}{\sum_{l=1}^{4096/2} \exp\left(\sum_{m=1}^{16}(1-b_m(k=m:1))LLR_{16QAM}(b_m)\right)} \right) \quad (11)$$

In Equation (11), "$b_m$(k=m: 0 or 1)" represents the m-th bit and is 0 or 1 when "m=k". There are 4,096 8-dimensional symbols present in the present embodiment. Here, by using the relationship of "x→−∞, exp (x)", it becomes possible to narrow down the 8-dimensional symbol candidates that are required to be calculated by Expression (11). Specifically, the symbol configuration rules of portions (b) to (d) of FIG. 5 are used. From the portion (b) of FIG. 5, the points of 16QAM are classified into four groups A0, A1, B0, and B1. The portion (c) of FIG. 5 shows possible group relationships in relation to other dimensions. A0, A1, B0, and B1 are finally divided into 16 subsets. Accordingly, the number of candidate points of each group (A0, A1, B0, and B1) for each 2-dimensional 16QAM is narrowed down from four to one (the operation concerning the above Equation (11) is referred to as first operation).

For example, from the expression "x→−∞, exp (x)" and the Equation (9), it is found that it is sufficient to set the symbol point having the maximum $P_S$ 16QAM (16QAM is the subscript of S) as a candidate. Moreover, the relationship between the bits assigned to the symbols and the respective groups is designed as shown in the portion (d) of FIG. 5. Therefore, after hard determination of a reception signal has been performed, it is possible to find a candidate point where $P_S$ 16QAM (16QAM is the subscript of S) in each group becomes maximum by inverting bits having a small 16QAM-LLR absolute value. Also, from the portion (c) of FIG. 5, since the combination of the candidate points is limited to 16 subsets, the Equation (11) can be simplified to the following Equation (12) (the above operation is referred to as second operation).

[Equation 12]

$$LLR_{8D}(k) \approx \log_e \left( \frac{\sum_{l=1}^{16} \exp\left(\sum_{m=1}^{16} (1 - b_m(k = m:0))LLR_{16QAM}(b_m)\right)}{\sum_{l=1}^{16} \exp\left(\sum_{m=1}^{16} (1 - b_m(k = m:1))LLR_{16QAM}(b_m)\right)} \right) \quad (12)$$

The 8-dimensional LLR calculation unit 232a calculates an 8D-16QAM-LLR, using the above Equations (11) and (12). The soft determination error correction code decoding circuit 233a performs soft determination error correction, based on the 8D-16QAM calculated by the 8-dimensional LLR calculation unit 232a.

FIG. 8 shows a comparison result of the calculation amount in the Equations (1) and (12). FIG. 8 is a diagram showing the comparison result. As shown in FIG. 8, it can be understood that the proposed method has a remarkably reduced calculation amount as compared with the conventional method.

According to the optical transmission device 100 configured as described above, it is possible to reduce the amount of calculation. Specifically, the optical transmitter 10 adds redundant bits used for soft determination error correction to the input bit string, associates the input bit string with signal points in the N-dimensional space, and outputs modulation signals corresponding to the N-dimensional symbols. The optical receiver 20 obtains a log likelihood ratio for each M dimension in a reception signal and obtains a log likelihood ratio of the N dimensional symbol from the log likelihood ratio for each M dimension. With this type of configuration, the need for calculating Euclidean distances for all candidate multidimensional symbols is eliminated. As a result, when applying a soft determination error correction code, it is possible to reduce the amount of calculation.

Here, a method of deciding M (natural number) will be described. It is desirable to set M as small as possible, that is to say, it is desirable to set the dimension of the M dimension as low as possible. By setting M to a small value, a low dimensional LLR can be calculated more easily. As a specific example, a comparison is made between a case where "M=1" and a case where "M≥2". In the case of "M=1", it is possible to calculate an LLR by simple calculations as in Equations (7) and (8). On the other hand, in the case of "M≥2", it is difficult to directly calculate Equation (1). For this reason, it is necessary to prepare in advance a calculation result corresponding to the value of $E_r$ in Expression (1) as a lookup table. Even when a lookup table is used, it is desirable that M is a small value. As a result, it is possible to prevent the size of the lookup table from increasing exponentially as M increases.

Figures 9, 10:
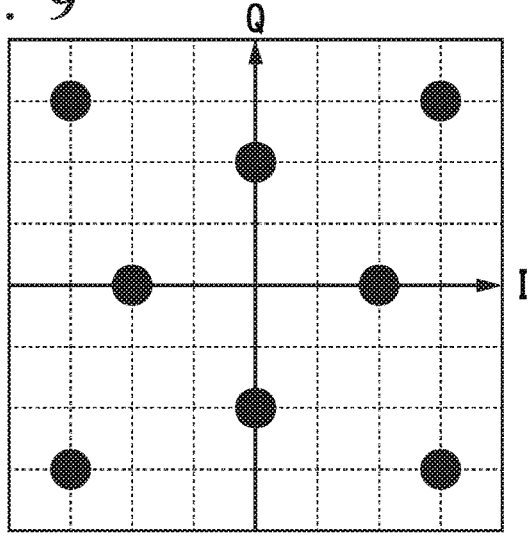
FIG. 9 is a diagram showing a constellation shape in a case of 8QAM in the present embodiment.
FIG. 10 is a diagram showing an example of a lookup table in the case of 16QAM in the present embodiment.

A specific example of a case where it is necessary to prepare a lookup table will be described. FIG. 9 is a diagram showing a constellation shape in the case of 8QAM. In the example shown in FIG. 9, it is necessary to find an M-dimensional LLR where "M=2". Therefore, in the example shown in FIG. 9, a 2-dimensional lookup table is required to obtain a 2-dimensional LLR.

As a method for finding a low dimensional LLR, the method that uses Equations (7) and (8) has been described above with the case of 1 dimension (that is to say, in the case of "M=1"), taking the case of 16QAM as an example. As a method for finding a low dimensional LLR, another method for realizing this is described, and this method differs from the method that uses Equations (7) and (8). More specifically, a method using a lookup table can be used as a method for finding an LLR in the case of a 2 or more dimension (that is, "M≥2") and the dimension is low. When $E_r$ and $E_k$ in Equation (1) are M dimensions, the value of Equation (1) is calculated in advance according to the value of $E_r$ and the calculation result is held. When calculating an LLR, a value is read from the lookup table according to the value of $E_r$. By using the lookup table, it becomes unnecessary to calculate the "log ( )" and "exp ( )" portions of the Equation (1). Therefore, circuit implementation becomes easy. FIG. 10 is a diagram showing an example of a lookup table in the case of 16QAM. In FIG. 10, black dots indicate $E_k$. For each of regions f(1, 1) to f(8, 8), the value of Equation (1) is preliminarily calculated and held. By changing the position of $E_k$, it is possible to deal with an arbitrary constellation shape.

Modified Example

In the above description, the N-dimensional symbol mapping circuit 113 is configured with L mapping circuits of M dimensions, but depending on the value, L may not be an integer, that is to say, there may be a remainder. For example, when "N/M=L with remainder R (R is an integer greater than or equal to 1)", the 8-dimensional LLR calculation unit 232 calculates an N-dimensional LLR, based on L LRRs and 1 R dimensional LLR. In addition, as a variation, the 8-dimensional LLR calculation unit 232 may further divide the R dimension by K (K<R) dimensional LLR to calculate the N-dimensional LLR.

Equation (12) makes it possible to improve the level of circuit implementation by using a relational equation such as the following Equation (13).

[Equation 13]

$$\log(\exp(A)+\exp(B))=\max(A,B)+\log(1+\exp(-1\exp(-|A-B|))) \quad (13)$$

By holding the second term on the right side of the Equation (13) as a lookup table, it becomes unnecessary to calculate the log and exp portions, thereby enabling a further reduction in the amount of calculation. When Equation (13) is applied to Equation (12), Equation (13) is applied recursively.

Equation (13) can be approximated as shown in the following Equation (14).

[Equation 14]

$$\log(\exp(A)+\exp(B))=\max(A,B)+\log(1+\exp(-|A-B|)) \approx \max(A,B) \quad (14)$$

By using Equation (14), Equation (12) can be approximated as shown in the following Equation (15).

[Equation 15]

$$LLR_{8D}(k) \approx \max_{16 \in b_m(k=m:0)} \left(\sum_{m=1}^{16} (1 - b_m(k = m:0))LLR_{16QAM}(b_m)\right) - \max_{16 \in b_m(k=m:1)} \left(\sum_{m=1}^{16} (1 - b_m(k = m:1))LLR_{16QAM}(b_m)\right) \quad (15)$$

Expression (12) is transformed into the following Equation (16).

[Equation 16]

$$LLR_{8D}(k) \approx \log_e\left\{\sum_{l=1}^{16} \exp\left(\sum_{m=1}^{16} (1 - b_m(k=m:0))LLR_{16QAM}(b_m)\right)\right\} - \log_e\left\{\sum_{l=1}^{16} \exp\left(\sum_{m=1}^{16} (1 - b_m(k=m:1))LLR_{16QAM}(b_m)\right)\right\} \quad (16)$$

The first term of Equation (16) is "$b_m=0$" when "k=m". The second term of Equation (16) is "$b_m=1$" when "k=m". As a result, Expression (12) can be transformed into the following Equation (17).

[Equation 17]

$$LLR_{8D}(k) \approx LLR_{16QAM}(k) + w(k) \quad (17)$$

W(k) in Equation (17) is as shown in the following Equation (18).

[Equation 18]

$$W(k) = \log_e\left\{\sum_{l=1}^{16} \exp\left(\sum_{m=1...m\neq k}^{16} (1 - b_m(k=m:0))LLR_{16QAM}(b_m)\right)\right\} - \log_e\left\{\sum_{l=1}^{16} \exp\left(\sum_{m=1...m\neq k}^{16} (1 - b_m(k=m:1))LLR_{16QAM}(b_m)\right)\right\} \quad (18)$$

Similarly, Equation (15) is transformed into the following Equation (19).

[Equation 19]

$$LLR_{8D}(k) \approx LLR_{16QAM}(k) + W'(k) \quad (19)$$

W(k) in Equation (19) is as shown in the following Equation (20).

[Equation 20]

$$W'(k) = \max_{16 \in b_m(k=m:0)}\left(\sum_{m=1,m\neq k}^{16} (1 - b_m(k=m:0))LLR_{16QAM}(b_m)\right) - \max_{16 \in b_m(k=m:1)}\left(\sum_{m=1,m\neq k}^{16} (1 - b_m(k=m:1))LLR_{16QAM}(b_m)\right) \quad (20)$$

Here, W(k) and W'(k), that is, Equations (18) and (20) are compared. When the distance between A and B (the absolute value of the difference) becomes small from the Equation (13), the second term on the right side of the Equation (13) becomes large. On the other hand, in the Equation (12), the inside of the portion of "exp ( )" corresponding to A and B represents a log likelihood, and becomes larger as the reception signal is closer to the symbol point of interest. For the purpose of simplicity, let S(A) be the symbol point with the highest log likelihood, and let S(B) be the symbol point with the second highest log likelihood. Also, the log likelihood for each symbol is denoted as A, B. Therefore, when the absolute value of the difference between A and B is small, the reception signal is present between S(A) and S(B), and the first term on the right side of Equation (13) becomes smaller. To summarize the above, in Equation (13), max (A, B) becomes small and log (1+exp (−|A−B|)) becomes large when |A−B| is small. Moreover, max (A, B) becomes large and log (1+exp (−|A−B|)) becomes small when |A−B| is large. When this relationship is applied to Equations (18) and (20), the calculation part of "max (•)" of the term including the symbol closest to the reception signal becomes large and the term of log (1+exp (−|•|)) becomes small. That is to say, the relationship of the following Equation (21) becomes established.

[Equation 21]

$$|w(k)| < |W'(k)| \quad (21)$$

That is to say, an error is statistically generated by approximation by Expression (21) for Expression (19). Therefore, by reducing this statistical error, it is possible to reduce characteristic deterioration due to approximation.

Specifically, as shown in Equation (22), it is sufficient to provide a coefficient of "$0 \leq \alpha \leq 1$" or to use an offset coefficient of "$\beta \geq 0$" as Equation (23). In addition, another method may be used as long as the relationship of Equation (21) is satisfied.

[Equation 22]

$$LLR_{8D}(k) \approx LLR_{16QAM}(k) + \alpha W'(k) \quad (22)$$

[Equation 23]

$$LLR_{8D}(k) \approx LLR_{16QAM}(k) + \text{sign}(W'(k))\max(|W'(k)|-\beta, 0) \quad (23)$$

For the Equation (22), multiplication of the decimal point occurs. Equation (23) can be realized only by summation and comparison operations, thus simplifying circuit implementation. Moreover since the optimum values of the coefficients $\alpha$ and $\beta$ change depending on the SNR of the input signal, the performance can be improved by performing optimization according to the SNR of the input signal.

Figure 11:
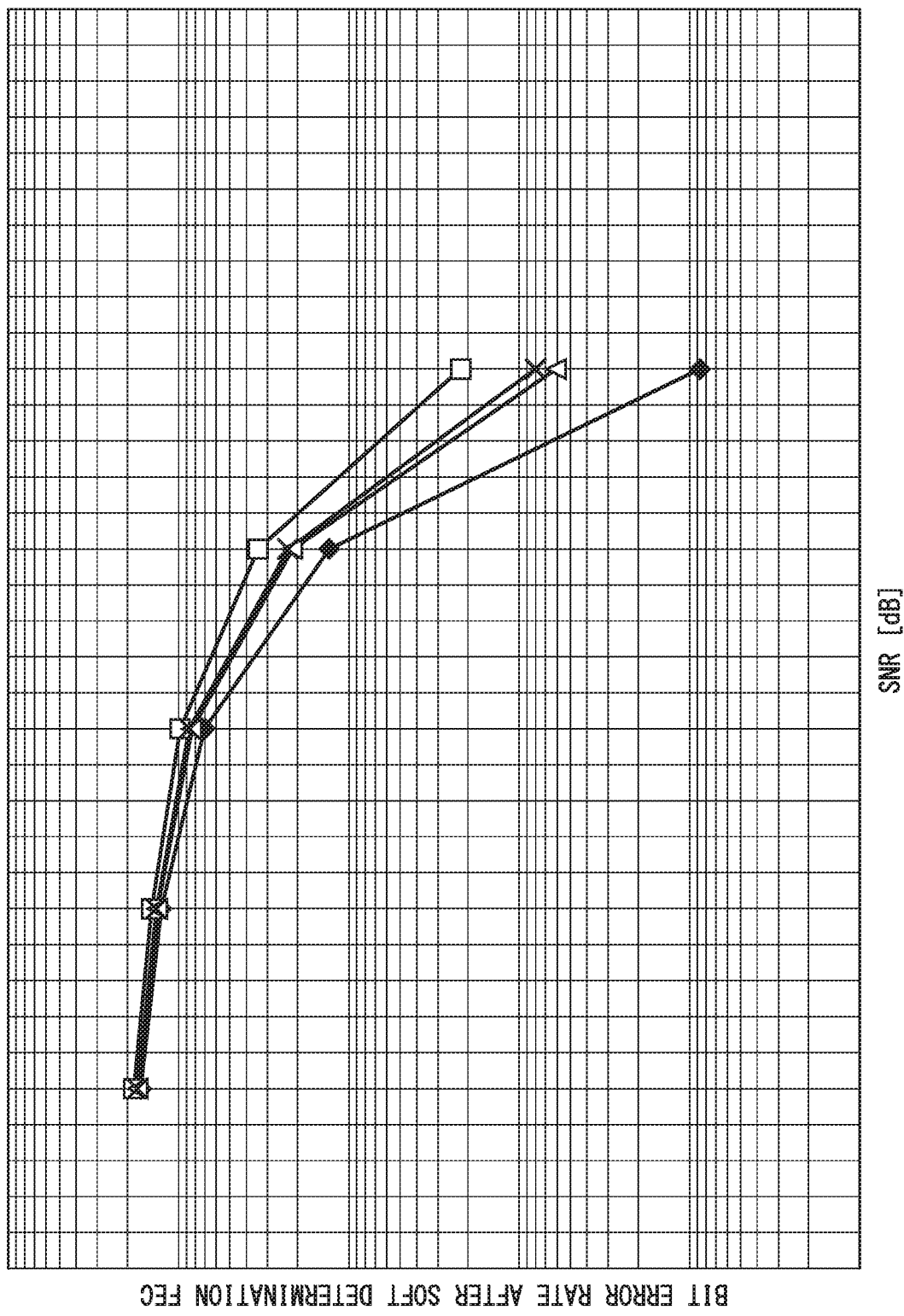
FIG. 11 is a diagram showing bit error rate characteristics after soft determination error correction (FEC) in each calculation equation in the present embodiment.

FIG. 11 is a diagram showing bit error rate characteristics after soft determination error correction (FEC) in each calculation equation in the present embodiment. In FIG. 11, the vertical axis represents the bit error rate of the output from the soft determination error correction code decoding circuit 232a. The horizontal axis represents the SNR of the 8-dimensional reception signal. The plots of the rhombus ("◇" in FIG. 11) in FIG. 11 show the result of using the 8-dimensional LLRs obtained by Equation (12). Similarly, the plots of the squares ("□" in FIG. 11) in FIG. 11 show the result of using the 8-dimensional LLRs obtained by Equation (15). The plots of the triangles ("Δ" in FIG. 11) in FIG. 11 show the result of using the 8-dimensional LLRs obtained by Equation (22). The plots of the crosses ("x" in FIG. 11) in FIG. 11 show the result of using the 8-dimensional LLRs obtained by Equation (23). It can be understood that using Equation (22) or Equation (23) in FIG. 11 brings the performance to near that before approximation.

Figure 12:
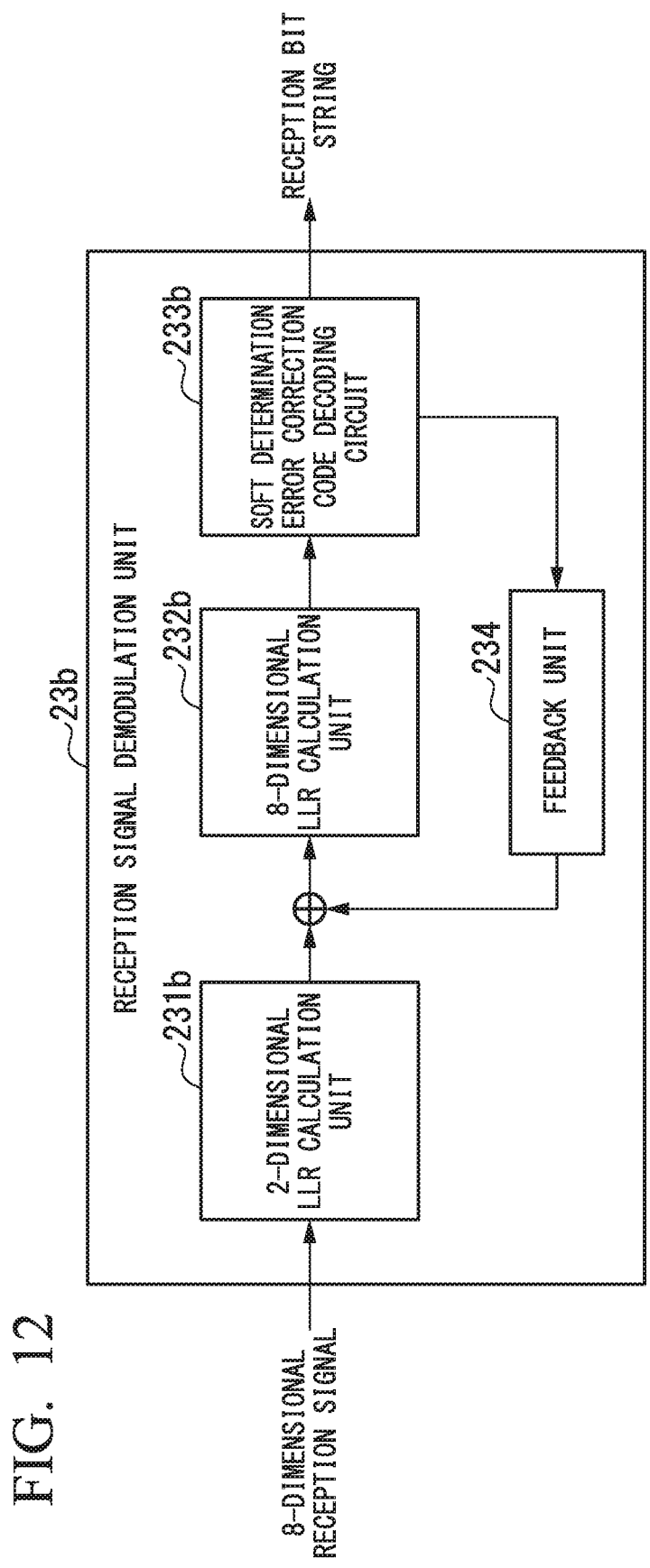
FIG. 12 is a diagram showing another configuration of the reception signal demodulation unit 23 according to the present embodiment.

The reception signal demodulation unit 23 may be configured as shown in FIG. 12. FIG. 12 is a diagram showing another configuration of the reception signal demodulation unit 23. As shown in FIG. 12, the reception signal demodulation unit 23b comprises a 2-dimensional LLR calculation unit 231b, an 8-dimensional LLR calculation unit 232b, a soft determination error correction code decoding circuit 233b, and a feedback unit 234. The 2-dimensional LLR calculation unit 231b, the 8-dimensional LLR calculation unit 232b, and the soft determination error correction code decoding circuit 233b each perform the same process as the functional units of the same name shown in FIG. 6. The feedback unit 234 accepts an input of prior information, which is an output from the soft determination error correction code decoding circuit 233b. The prior information is expressed by the following Equation (24).

[Equation 24]

$$LLR_{soft\ dec.}(b_1) = LLR_{soft\ dec.\ output}(b_1) - LLR_{8D}(b_1) \quad (24)$$

Here, "$LLR_{soft\ dec.}(b_1)$" represents the prior information output from the soft determination error correction code decoding circuit 233b. "$LLR_{soft\ dec.\ output}(b_1)$" represents an output from the soft determination error correction code decoding circuit 233b. "$LLR_{8D}(b_1)$" represents an input to the soft determination error correction code decoding circuit 233b. As shown in FIG. 12, the feedback unit 234 adds this prior information to the 16QAM-LLR output from the 2-dimensional LLR calculation unit 231 (16QAM-LLR of each 2-dimensional symbol), to thereby update the 16-QAM-LLR as shown in Equation (25).

[Equation 25]

$$LLR_{16QAM}(b_m)' = LLR_{16QAM}(b_m) + LLR_{soft\ dec.}(b_1) \quad (25)$$

Here, the soft determination error correction code is not applied to the bits of Expressions (3) to (6). Therefore, "$l \in (1, 2, 3, 4, 5, 6, 7, 9, 10, 11, 13, 14)$" and "$m \in (1, 2, 3, 4, 5, 6, 7, 8, 9, 10, 11, 12, 13, 14, 15, 16)$" are established. By applying the updated 16QAM-LLR to the Equation (12), the 8-dimensional LLR calculation unit 232b can find an updated 8-dimensional LLR. In this way, even when the feedback unit 234 is added, the amount of calculation can be reduced.

Figure 13:
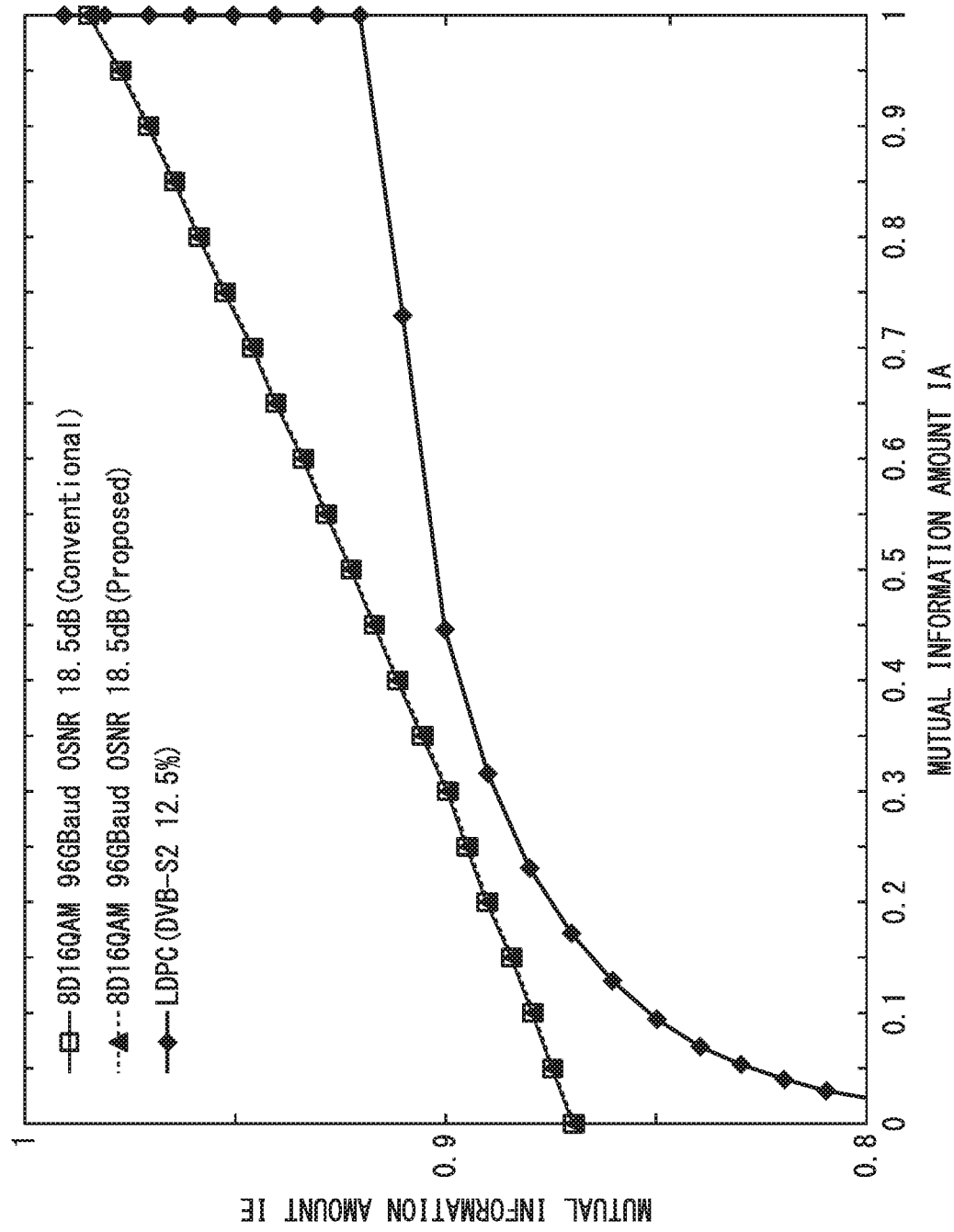
FIG. 13 is a diagram showing results of an exit chart analysis in the present embodiment.

FIG. 13 shows the results of performing an Exit Chart analysis in order to evaluate the decoding performance of the method using Equation (2), which is the conventional method, and the method using Equations (12) and (25) of the proposed method. For the Exit Chart analysis, the technique disclosed in Reference Document 2 may be used (Reference Document 2: Stephan ten Brink. "Convergence Behavior of Iteratively Decoded Parallel Concatenated Codes". IEEE TRANSACTIONS ON COMMUNICATIONS, VOL. 49, NO. 10, pp. 1727 October 2001).

In FIG. 13, the vertical axis represents mutual information amount of the output from the 8D16QAMLLR calculation unit 232b. The horizontal axis represents mutual information amount of prior probabilities. The plots of the squares ("☐" in FIG. 13) in FIG. 13 show the result of the conventional method. The plots of the triangles ("▲" in FIG. 13) show the result of the proposed method. As can be understood from FIG. 13, there was no performance degradation by the proposed method. In FIG. 13, the plots of the rhombus ("◇" in FIG. 13) show the result of the decoder in the LDPC code which is a type of soft determination error correction. If the line of the conventional method does not cross the line of ◇, it is analytically shown that error correction can be executed correctly when the prior information is fed-backed.

When adding the feedback unit 234, the prior information of the feedback unit 234 may be subtracted from the updated 8-dimensional LLR calculated in the 8-dimensional LLR calculation unit 232b using the prior information. By performing this operation, it is possible to perform error correction in the next step without allowing propagation of error information about the bits that caused the error correction in the soft determination error correction code decoding circuit in the previous step. Specifically, the 8-dimensional LLR is updated using Equation (12), Equation (15), Equation (22) or Equation (23) and the value of the prior information in Equation (24) is subtracted for each corresponding bit.

In general, iterative calculation (iteration) is performed in the soft determination error code decoding circuit 232b of LDPC code, turbo code, or the like. In the case of adopting a feedback configuration in this method, updating of the 8-dimensional LLR and soft determination error correction are repeatedly performed, and the information amount is updated in a stepwise manner as shown in FIG. 13. Therefore, it is possible to reduce the number of iterations in the soft determination error code decoding circuit 232b. Here, the iterative calculation in the soft determination error code decoding circuit 232b is defined as internal iteration, and the iterative calculation using the feedback unit 234 is defined as external iteration. In this case, by optimizing the number of internal iterations and external iterations, it is possible to obtain the same performance with a smaller number of calculations and to reduce delay in decoding.

Figure 14:
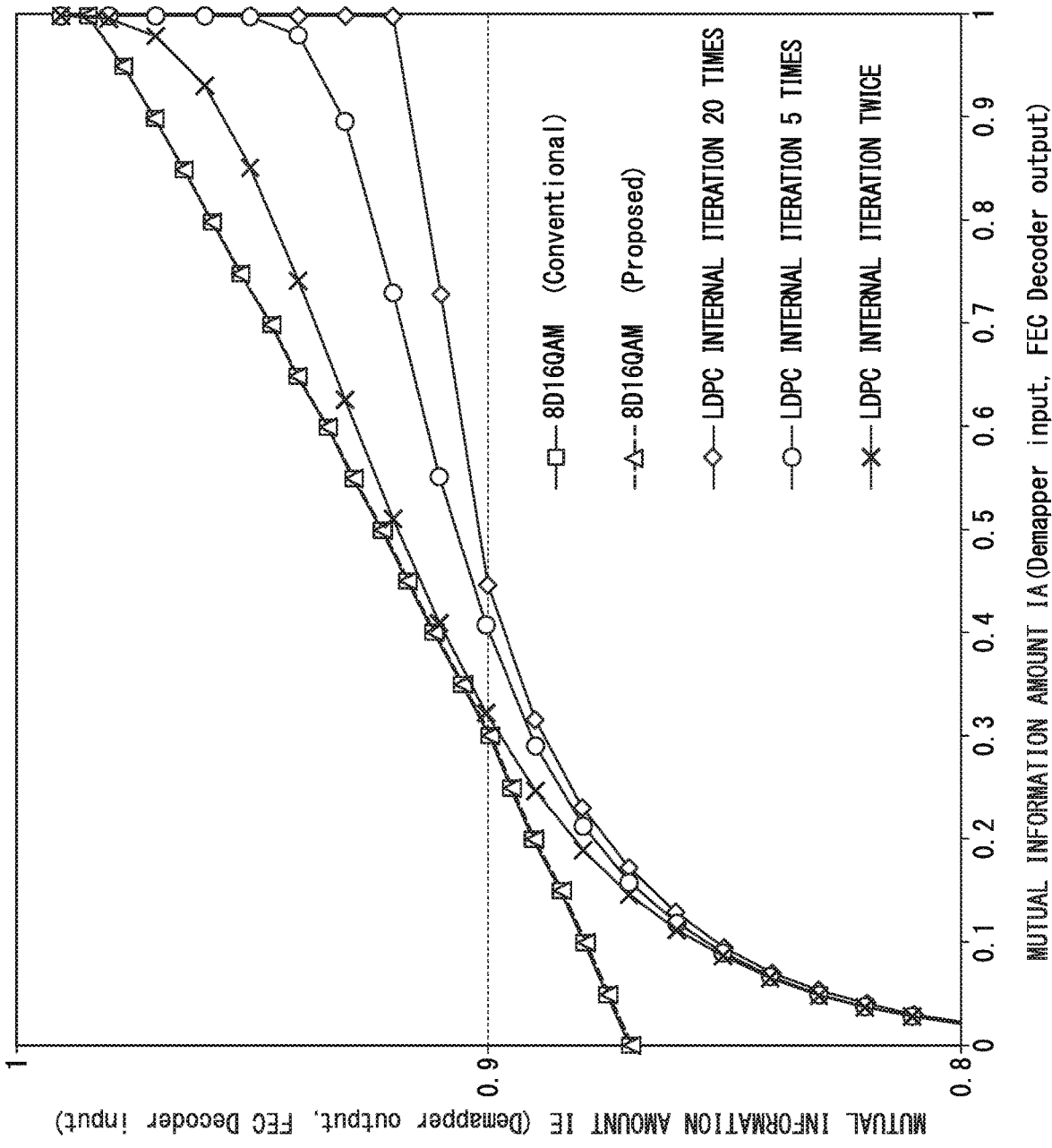
FIG. 14 is a diagram showing amounts of prior information to be fed back with respect to the number of internal iterations in LDPC in the present embodiment.

FIG. 14 is a diagram showing amounts of prior information to be fed back with respect to the number of internal iterations in LDPC. FIG. 14 shows the results of the Exit Chart analysis where LDPC is used as the soft determination error code decoding circuit 232b, and the number of iterations (the number of internal iterations) in the LDPC decoding circuit is changed to 20 times (plots "◇" in FIG. 14) 5 times ("plots of ○" in FIG. 14), and 2 times (plots of "x" in FIG. 14) (no other change made to FIG. 11 except for the number of LDPC iterations). Since none of the LDPC lines in the case of reducing the number of internal iterations and the line of the 8D16QAM, which is 8-dimensional modulation, do not cross with each other, when the prior information is fed back correctly, decoding can be performed correctly as described above with reference to FIG. 13. However, in the case where the internal iteration is performed twice, since it is in the close vicinity of the line of 8D16QAM, it is necessary to increase the number of external iterations in order to correctly perform decoding.

Next, an example of 4-dimensional modulation (4D7 bit-16QAM) in the present embodiment will be described.

[Equation 26]

$$b_8 = b_1 \oplus b_2 \oplus b_3 \oplus b_4 \oplus b_5 \oplus b_6 \oplus b_7 \quad (26)$$
$$= \sum_{m=1}^{7} b_m$$

In Equation (26), the plus sign surrounded by the circle denotes exclusive OR. "Σ" represents addition in exclusive OR. $b_1$ to $b_8$ are mapped to two 16QAM symbols and output. When the above redundant bits are added, the posterior probability of the 4-dimensional symbol can be found similarly to Equations (9) and (10), and the 4-dimensional LLR can be found from Equation (11). In addition, in the case of this example, when finding the 16QAM symbols as candidates for performing the first operation, it is possible to consider separating them into subsets of A and B in FIG. 5. In this case, if the same operation as the second operation above is applied, from Equation (9), it is possible to find candidates of bit strings in which $P_{s16QAM}$ becomes maximum in each of the groups (A, B) as a result of inverting bits with small absolute values of 16QAM-LLR. In the example of the portion (b) in FIG. 5, when the exclusive OR of 4-bit data corresponding to 16QAM is "1", the point of 16QAM belongs to the group of A. On the other hand, when the exclusive OR is "0", the point of 16QAM belongs to the group of B. In the example of the portion (b) in FIG. 5, the combination of candidate points is limited to two combinations (A, A) or (B, B), from the Equation (26). From the above, when finding candidates of bit strings so that $P_{s\,4D\text{-}16QAM}$, which is the 4-dimensional version of Equation (10), is the maximum, only the bits $b_m$ corresponding to 16QAM-LLR with small absolute value are inverted ("0→1" or "1→0"), and the positive/negative of 16QAM-LLR corresponds to "0" and "1" of the bit. Therefore, Equation (15) can be further transformed and expressed as Equation (27).

[Equation 27]

$$LLR_{4D}(k) \approx \\ LLR_{16QAM}(k) + \prod_{m \neq k} \text{sign}(LLR_{16QAM}(m)) \min_{m \neq k}\{|LLR_{16QAM}(m)|\} \quad (27)$$

In Equation (27), the portion of "sign ( )" represents the positive/negative of "$LLR_{16QAM}(m)$".

Also, for Equation (27), by performing the same operations of Equations (22) and (23) on the second term on the right side of Equation (27), that is to say, by multiplying the right side by a coefficient as with Equations (22) and (23) or by setting an offset coefficient, performance deterioration due to approximation can be mitigated by multiplying coefficients or setting offset coefficients.

Next, an example of 8-dimensional modulation (8D15 bit-16QAM) in the present embodiment will be described.

[Equation 28]

$$b_{16} = b_1 \oplus b_2 \oplus b_3 \oplus b_4 \oplus b_5 \oplus b_6 \oplus \ldots \oplus b_{15} \quad (28)$$
$$= \sum_{m=1}^{15} b_m$$

In Equation (28), the plus sign surrounded by the circle denotes exclusive OR. "Σ" represents addition in exclusive OR. $b_1$ to $b_{16}$ are mapped to four 16QAM symbols and output. When the above redundant bits are added, the posterior probability of the 8-dimensional symbol can be found similarly to Equations (9) and (10), and the 8-dimensional LLR can be found from Equation (11). In addition, in the case of this example, when finding the 16QAM symbols as candidates for performing the first operation, it is possible to consider separating them into subsets of A and B in FIG. 5. In this case, if the same operation as the second operation above is applied, from Equation (9), it is possible to find candidates of bit strings in which $P_{s16QAM}$ becomes maximum in each of the groups (A, B) as a result of inverting bits with small absolute values of 16QAM-LLR. In the example of the portion (b) in FIG. 5, when the exclusive OR of 4-bit data corresponding to 16QAM is "1", the point of 16QAM belongs to the group of A. On the other hand, when the exclusive OR is "0", the point of 16QAM belongs to the group of B. In the example of the portion (b) in FIG. 5, the combination of candidate points is limited to eight combinations, from the Equation (28). From the above, when finding candidates of bit strings so that $P_{s8D\text{-}16QAM}$ of Equation (10) is the maximum, only the bits bm corresponding to 16QAM-LLR with small absolute value are inverted ("0→1" or "1→0"), and the positive/negative of 16QAM-LLR corresponds to "0" and "1" of the bit. Therefore, Equation (15) can be further transformed and expressed as Equation (29).

[Equation 29]

$$LLR_{8D}(k) \approx LLR_{16QAM}(k) + \prod_{m \neq k} \text{sign}(LLR_{16QAM}(b_m)) \\ \min_{m \neq k}\{|LLR_{16QAM}(b_m)|\} \quad (29)$$

In Equation (29), the portion of "sign ( )" represents the positive/negative of "$LLR_{16QAM}(m)$".

Also, for Equation (29), by performing the same operations of Equations (22) and (23) on the second term on the right side of Equation (27), that is to say, by multiplying the right side by a coefficient as with Equations (22) and (23) or by setting an offset coefficient, performance deterioration due to approximation can be mitigated by multiplying coefficients or setting offset coefficients.

Next, an example of N-dimensional (N is a multiple of 2) modulation of a general system in the present embodiment will be described.

[Equation 30]

$$b_{2*N} = b_1 \oplus b_2 \oplus b_3 \oplus b_4 \oplus b_5 \oplus b_6 \oplus \ldots \oplus b_{2*N-1} \quad (30)$$
$$= \sum_{m=1}^{2*N-1} b_m$$

In Equation (28), the plus sign surrounded by the circle denotes exclusive OR. "Σ" represents addition in exclusive OR. $b_1$ to $b_{2*N-1}$ are mapped to N/2 16QAM symbols and output. When the above redundant bits are added, the posterior probability of the N-dimensional symbol can be found similarly to Equations (9) and (10), and the N-dimensional LLR can be found from Equation (11). In addition, in the case of this example, when finding the 16QAM symbols as candidates for performing the first operation, it is possible to consider separating them into subsets of A and B in FIG. 5. In this case, if the same operation as the second operation above is applied, from Equation (9), it is possible to find candidates of bit strings in which Psi 6QAM becomes maximum in each of the groups (A, B) as a result of inverting bits with small absolute values of 16QAM-LLR. In the example of the portion (b) in FIG. 5, when the exclusive OR of 4-bit data corresponding to 16QAM is "1", the point of 16QAM belongs to the group of A. On the other hand, when the exclusive OR is "0", the point of 16QAM belongs to the group of B. In the example of the portion (b) in FIG. 5, the combination of candidate points is limited to $2^{(N/2-1)}$ combinations, from the Equation (30). From the above, when finding candidates of bit strings so that $P_{s\,ND\text{-}16QAM}$, which is the N-dimensional version of Equation (10), is the maximum, only the bits $b_m$ corresponding to 16QAM-LLR with small absolute value are inverted ("0→1" or "1→0"), and the positive/negative of 16QAM-LLR corresponds to "0" and "1" of the bit. Therefore, Equation (15) can be further transformed and expressed as Equation (31).

[Equation 31]

$$LLR_{ND}(k) \approx LLR_{16QAM}(k) + \prod_{m \neq k} \text{sign}(LLR_{16QAM}(b_m)) \\ \min_{m \neq k}\{|LLR_{16QAM}(b_m)|\} \quad (31)$$

In Equation (31), the portion of "sign ( )" represents the positive/negative of "$LLR_{16QAM}(m)$".

Also, for Equation (31), by performing the same operations of Equations (22) and (23) on the second term on the right side of Equation (27), that is to say, by multiplying the right side by a coefficient as with Equations (22) and (23) or by setting an offset coefficient, performance deterioration due to approximation can be mitigated by multiplying coefficients or setting offset coefficients.

In the above description, there have been described the method in which the M-dimensional LLR calculation unit 231 obtains M-dimensional LLRs using equations (such as Equations (7) and (8)) and the method in which the M-dimensional LLR calculation unit 231 obtains M-dimensional LLRs using a lookup table. However, these methods may be combined. For example, the M-dimensional LLR calculation unit 231 may select either the method that uses equations or the method that uses a lookup table as a method for obtaining LLRs according to the type of the received N-dimensional reception signal.

A program for realizing all or a part of the functions of the optical transmitter 10 and the optical receiver 20 may be recorded on a computer-readable recording medium, and the program recorded on this recording medium may be read and executed on a computer system to thereby perform processing of each part thereof. Note that the "computer system" referred to here includes an operating system and hardware such as peripheral devices. Moreover, the "computer system" also includes a homepage providing environment (or display environment) if it uses a WWW system.

The "computer-readable recording medium" refers to a movable medium such as a flexible disk, a magnetic optical disk, a ROM, and a CD-ROM, or a memory device such as a hard disk built in a computer system. Furthermore, the "computer-readable recording medium" includes one that dynamically holds a program for a short period of time such as a communication line in those cases of transmitting the program via a network such as the Internet or a communication line such as a telephone line, and one that holds a program for a certain period of time such as a volatile memory inside a computer system serving as a server or a client in those cases. Further, the above program may be for realizing a part of the functions described above, or may be one that realizes the functions described above in combination with a program already recorded in the computer system.

The embodiment of the present invention has been described above in detail with reference to the drawings. However, the specific configuration is not limited to this embodiment, and designs and the like not departing from the scope of the present invention are included.

INDUSTRIAL APPLICABILITY

The present invention can be applied to an optical receiver, an optical transmission device, and a method for an optical receiver.

REFERENCE SYMBOLS

10 Optical transmitter
11, 11 Transmission symbol generation unit
12 Optical modulation circuit
20 Optical receiver
21 Optical coherent receiver
22 Digital signal processing unit
23, 23*a*, 23*b* Reception signal demodulation unit
100 Optical transmission device
111, 111*a* Soft determination error correction code encoding circuit
112 N-dimensional encoding circuit
112*a* 8-dimensional encoding circuit
113 N-dimensional symbol mapping circuit
113*a* 8-dimensional symbol mapping circuit
231 M-dimensional LLR calculation unit
231*a*, 231*b* 2-dimensional LLR calculation unit
232 N-dimensional LLR calculation unit
232*a*, 232*b* 8-dimensional LLR calculation unit
233, 233*a*, 233*b* Soft determination error correction code decoding circuit
234 Feedback unit

The invention claimed is:

1. An optical receiver comprising:
at least one memory storing first instructions; and
at least one processor configured to execute the first instructions to:
receive a data signal containing data encoded into M-dimensional symbols;
compute a log likelihood ratio for each M-dimensional symbol in the data signal, wherein M represents a natural number;
compute a log likelihood ratio of an N-dimensional symbol based on the log likelihood ratio for each M-dimensional symbol, wherein N represents a natural number and M is less than N;
perform soft determination error correction based on the log likelihood ratio of the N-dimensional symbol to output a result of the soft determination error correction;
feed back the result of the soft determination error correction; and
compute a log likelihood ratio of the N-dimensional symbol, based on the log likelihood ratio of each M dimensional symbol that is updated based on the fed-back result.

2. The optical receiver according to claim 1,
wherein the computing the log likelihood ratio for each M-dimensional symbol comprises calculating a log likelihood ratio for each of L M-dimensional symbols, wherein L is a quotient of N divided by M, and
the computing the log likelihood ratio of the N-dimensional symbol comprises calculating a log likelihood ratio of an N-dimensional symbol based on the log likelihood ratio for each of the L M-dimensional symbols and a log likelihood ratio of one R-dimensional symbol when N divided by M is L with a remainder R, wherein R is integer greater than or equal to one.

3. An optical transmission device comprising:
an optical receiver; and
an optical transmitter,
wherein the optical receiver comprises:
at least one memory storing first instructions; and
at least one processor configured to execute the first instructions to:
receive a data signal containing data encoded into M-dimensional symbols;
compute a log likelihood ratio for each M-dimensional symbol in the data signal, wherein M represents a natural number; and
compute a log likelihood ratio of an N-dimensional symbol based on the log likelihood ratio for each M-dimensional symbol, wherein N represents a natural number and M is less than N, and
the optical transmitter comprises:
at least one memory storing second instructions; and
at least one processor configured to execute the second instructions to:
add, to an input bit string, a redundant bit used for soft determination error correction;

associate the input bit string to which the redundant bit is added with a signal point arrangement of an N dimensional space to output a result of the association;

generate a modulation signal corresponding to an N-dimensional symbol, based on the result of the association; and modulate light using the modulation signal and output it.

4. A method for an optical receiver, the method comprising:

receiving, by the optical receiver, a data signal containing data encoded into M-dimensional symbols;

computing, by the optical receiver, a log likelihood ratio for each M-dimensional symbol in the data signal, wherein M represents a natural number;

computing, by the optical receiver a log likelihood ratio of an N-dimensional symbol based on the log likelihood ratio for each M-dimensional symbol, wherein N represents a natural number and M is less than N;

performing soft determination error correction based on the log likelihood ratio of the N-dimensional symbol to output a result of the soft determination error correction;

feeding back the result of the soft determination error correction; and computing a log likelihood ratio of the N-dimensional symbol, based on the log likelihood ratio of each M dimensional symbol that is updated based on the fedback result.

* * * * *